United States Patent
Salzmann et al.

(10) Patent No.: US 6,189,352 B1
(45) Date of Patent: Feb. 20, 2001

(54) DRIVE DEVICE FOR ROLL STANDS

(75) Inventors: Theodor Salzmann, Spardorf; Johann Wokusch, Forchheim; Rolf-Dieter Klug, Nürnberg, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/194,215

(22) PCT Filed: May 9, 1997

(86) PCT No.: PCT/DE97/00945

§ 371 Date: Feb. 4, 1999

§ 102(e) Date: Feb. 4, 1999

(87) PCT Pub. No.: WO97/44888

PCT Pub. Date: Nov. 27, 1997

(30) Foreign Application Priority Data

May 21, 1996 (DE) ............................................. 196 20 246
Sep. 27, 1996 (DE) ............................................. 196 39 962

(51) Int. Cl.⁷ ...................................................... B21B 37/58

(52) U.S. Cl. ................................ 72/14.3; 72/29.1; 72/249

(58) Field of Search ..................................... 72/13.1, 13.2, 72/14.3, 29.1, 29.2, 249

(56) References Cited

U.S. PATENT DOCUMENTS

| | | | |
|---|---|---|---|
| 4,015,173 | 3/1977 | Nitsche . | |
| 4,864,385 | 9/1989 | Itahana et al. . | |
| 4,882,923 | * 11/1989 | Ichida et al. ............................. | 72/249 |
| 4,961,274 | 10/1990 | Matouk et al. . | |
| 5,491,370 | * 2/1996 | Schneider et al. ....................... | 310/54 |
| 5,712,802 | * 1/1998 | Kumar et al. .......................... | 364/557 |
| 5,860,310 | * 1/1999 | Wokusch ................................ | 72/249 |
| 6,002,183 | * 12/1999 | Iversen et al. ....................... | 307/147 |

FOREIGN PATENT DOCUMENTS 62086639    4/1987   (JP) .

OTHER PUBLICATIONS

D. W. Draper et al., "Thyristor–Supplied Tandem Cold Mill", Proc. IEEE, vol. 115, No. 10, Oct. 1968.
L. Bala Krishnan, "Economic Factors Governing the Specification and Selection of Electrical Equipment for Large Reversing Drives in Rolling Mills," ASEA Journal 1973, vol. 46, No. 4.
*W. Schulz et al., "Logidyn® für Antriebe in Industrieanlagen unter besonderer Berücksichtigung des Thyristor Leistungsteils," Techn. Mitt. AEG–TELEFUNKEN 62 (1972).
*K. Herrmann, "Electrical Equipment for a Highly Automated Cold Mill," ABB Review (1991) No. 5, Zurich, CH.
*R.C. Lach et al., "Paralleling Hot Strip Mill M–G Sets With SCR's for Additional Power," Iron and Steel Engineer, Aug. 1971.
*K. Moll, "Verivert K. Subsynchronous Converter Cascades," Brown Boven Review 8–87.
*W. Philipps, "Thyristorspeisung von Kaltwalzwerk–Antrieben," BBC–Nachrichten –Oct./Nov. 1970.

(List continued on next page.)

Primary Examiner—Ed Tolan
(74) Attorney, Agent, or Firm—Kenyon & Kenyon (57) ABSTRACT

A driving arrangement for rolling stands of a rolling mill, is described. The driving arrangement includes a control system which prescribes desired values for the rolling stands via control units, the rolling stands having at least one electric motor which is supplied with electric energy by a power supply system via at least one converter having turn-off power semiconductors. The converter has an air-cooled design. The cooling power is dimensioned such that the temperature of the turn-off power semiconductors does not exceed a critical temperature limit for continuous operation. The converter includes heat sinks which have an optimum design. At least some of the heat sinks are connected thermally in parallel.

29 Claims, 7 Drawing Sheets

OTHER PUBLICATIONS

*"Driving Mills with Alternating Current," Steel Times incorporating Iron & Steel 219 (1991) Jun., No. 6, Redhill, Surrey, GB.

*G. Fischer et al., "Design and Operational Behaviour of Air Cooled High Power 3–Level–Inverter with Reverse Conducting GTOs," Power Conversion, May 1996 Proceedings.

* cited by examiner

DRIVE DEVICE FOR ROLL STANDS

This application is a 371 of PCT/DE97/00945 filed May 9, 1997.

FIELD OF THE INVENTION

The present invention relates to a driving arrangement for rolling stands having an air-cooled converter.

BACKGROUND INFORMATION

It is known to design self-commutated converters for drives of rolling stands in a water-cooled fashion. Such designs, however, are expensive to produce and maintain.

SUMMARY OF THE INVENTION

It is the object of an present invention to provide a converter for drives of rolling stands which, in contrast with conventional converters in this power range, can be produced more easily.

It is also an object of the present invention to provide a converter for drives of rolling stands which, in contrast with conventional converters, is simpler and more cost-effective to operate and maintain.

The object is achieved according to the present invention by providing an air-cooled converter. Previously, air cooling was believed to be unsuitable for converters for drives of rolling stands which, in particular, are operated in a power range of 1 to 20 MW. However, it has proved that converters can be designed with air cooling in the power range designated above. In this case, by contrast with known water-cooled converters in the above-named power-range, such air-cooled converters have proved to be particularly cost-effective and easy to maintain.

In an advantageous embodiment of the present invention, heat sinks electrically connect individual turn-off power semiconductors. This electrical connection likewise represents a good thermal connection, with the result that the heat occurring in the power semiconductors is adequately dissipated. In this case, it has further proved to be advantageous to use heat sinks having such a high thermal capacity that the heat sinks react thermally with a time delay in the case of peak loads.

The driving arrangement according to the present invention is suitable, in particular, for converters having low operating frequencies. In the case of converters in a three-point circuit such as is shown, for example in FIG. 6, the drive system according to the present invention is used with particular advantage in the case of mean operating frequencies of the converter <250 Hz. In driving arrangements having a motor in a tandem connection, the drive system according to the present invention is suitable in a particularly advantageous fashion for mean operating frequencies <100 Hz.

In a further advantageous embodiment of the present invention, the converter has a blower which feeds ambient air or precooled air to the heat sinks, or advantageously sucks ambient air through the heat sinks.

DETAILED DESCRIPTION

Figure 1:
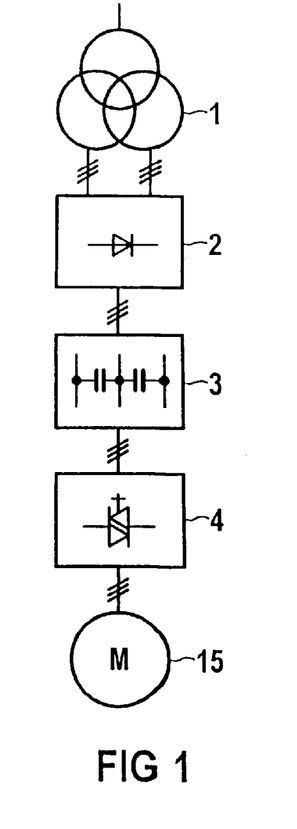
FIG. 1 shows a converter-fed motor having a diode rectifier on the line side.

A converter-fed motor 15 having a diode rectifier 2 on the line side is represented in FIG. 1. The converter arrangement is preferably designed as a series circuit of two 26 diode bridges. The line-side interfacing is performed via a transformer 1 having two secondary winding systems, preferably offset electrically by 301, for achieving a 12-pulse system perturbation. Diode rectifier 2 is connected on the DC voltage side to machine-side inverter 4 via voltage link 3. The link connection is preferably performed via three poles, the positive and negative link poles and the DC voltage center point. Machine-side inverter 4 is designed as a self-commutated inverter in a three-point circuit to whose output side three-phase AC motor 15 is connected via three conductors.

Figure 2:
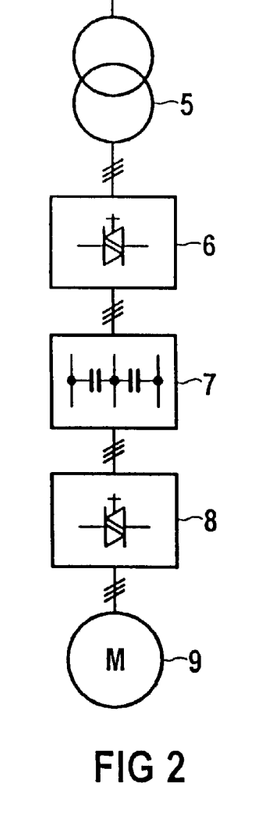
FIG. 2 shows a converter-fed motor having self-commutated rectifier and inverter, also on the line side.

A converter-fed motor 9 having self-commutated rectifier and inverter 6 and 8, also on the line side, is represented in FIG. 2. The rectifier arrangement comprises a line-side self-commutated rectifier 6, which is connected on the DC voltage side to machine-side inverter 8 via voltage link 7. Two component converters 6 and 8 are designed in a three-point circuit and the link connection is preferably performed via three poles, the positive and negative links and the DC voltage center point. Line-side self-commutated rectifier 6 is connected to the line via transformer 5. The circuit is preferably of the same design as that of machine-side inverter 8 and permits operation both as rectifier and as inverter for energy recovery, for example, in the braking operation of motor 9. The machine-side inverter is connected on its output side to the three-phase AC motor via three conductors.

Figure 3:
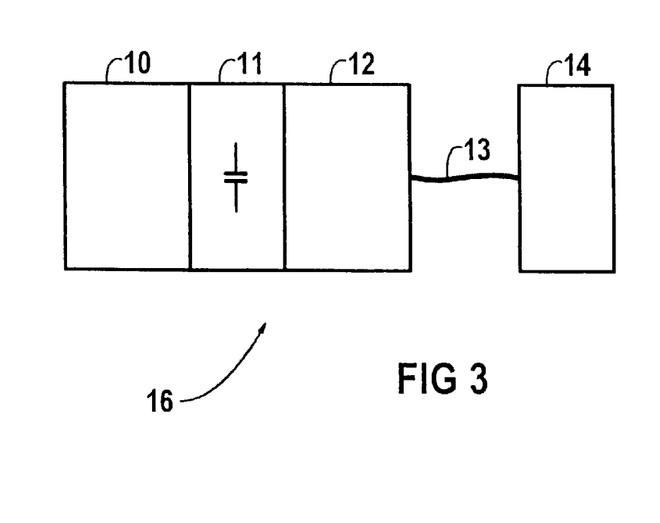
FIG. 3 shows a-converter arrangement having an automation device connected via optical fibers.

FIG. 3 shows a converter arrangement having an automation device 14 for controlling converter 16, the entire information exchange being performed via an optical fibre connection 13. Converter 16 has a line-side component converter 10, a voltage link 11 and a machine-side component converter 12. The power connections of the component converters to the line and the motor can be executed, for example, according to FIG. 1 and FIG. 2. Converter 10 contains all the sensors required for operation and monitoring, with the result that no further connection is required to the environment. It is not shown that both the converter and the automation device require an auxiliary power supply or battery.

Figure 4:
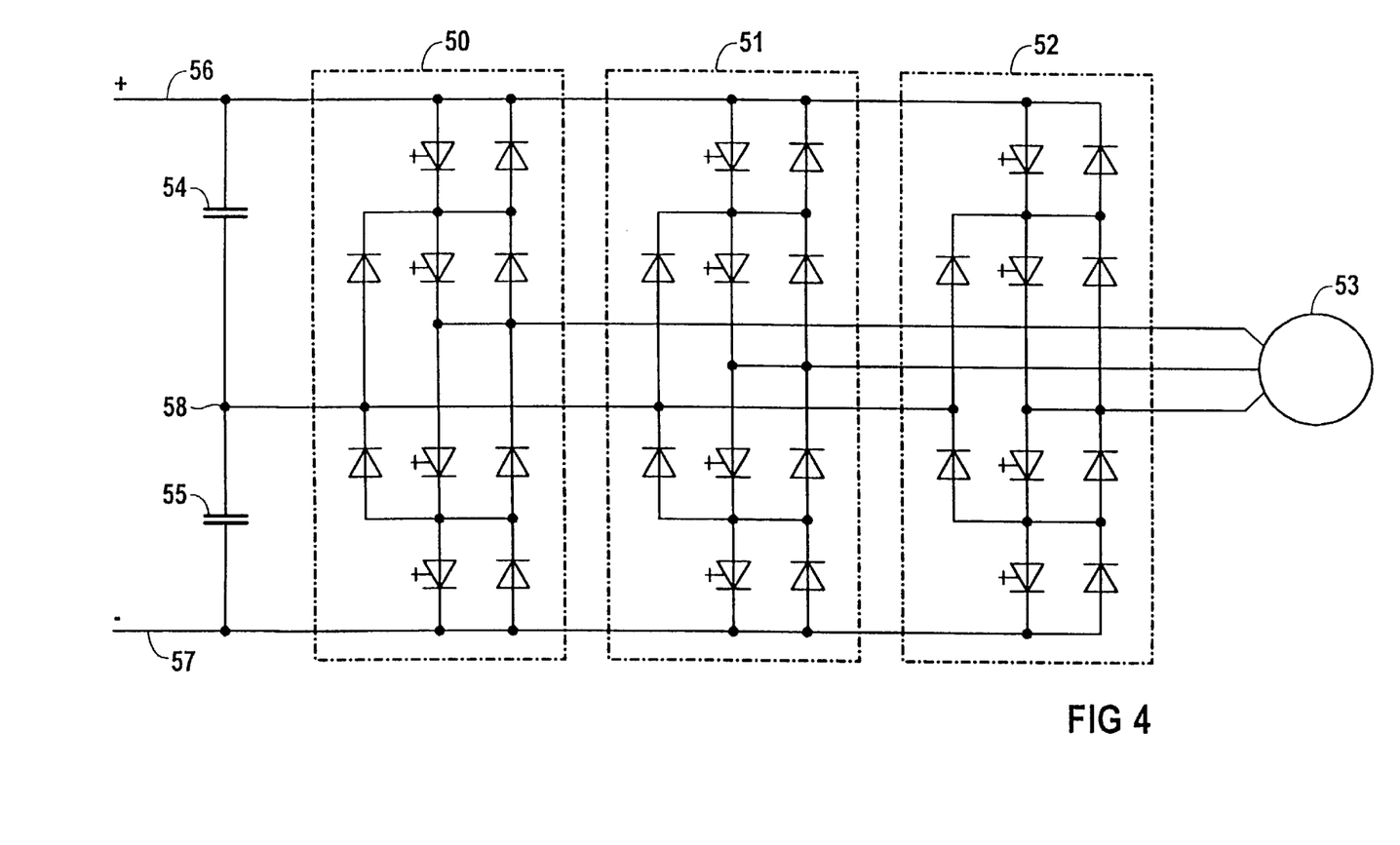
FIG. 4 shows a three-point inverter having GTO thyristors (main circuit without a protective circuit)

FIG. 4 shows the main circuit of a three-point inverter. Connected in series between positive DC voltage pole 56 and negative DC voltage pole 57 are P-side link capacitor 54 and N-side link capacitor 55. Their tie point forms DC voltage center point 58. Phase modules 50, 51, 52, in each case having four series-connected GTOs and anti-parallelconnected freewheeling diodes, are respectively connected between the positive and negative DC voltage poles. The tie point between the first and second GTOs of a phase module and the third and fourth GTOs of a phase module is respectively connected via an additional two diodes connected in series, and in antiparallel fashion, with the GTOs; the center point of these two diodes is, in each case, connected to DC voltage center point 58. The tie point between the second and third GTOs of a phase module forms the respective output terminal, which is connected to motor 53

Figure 5:
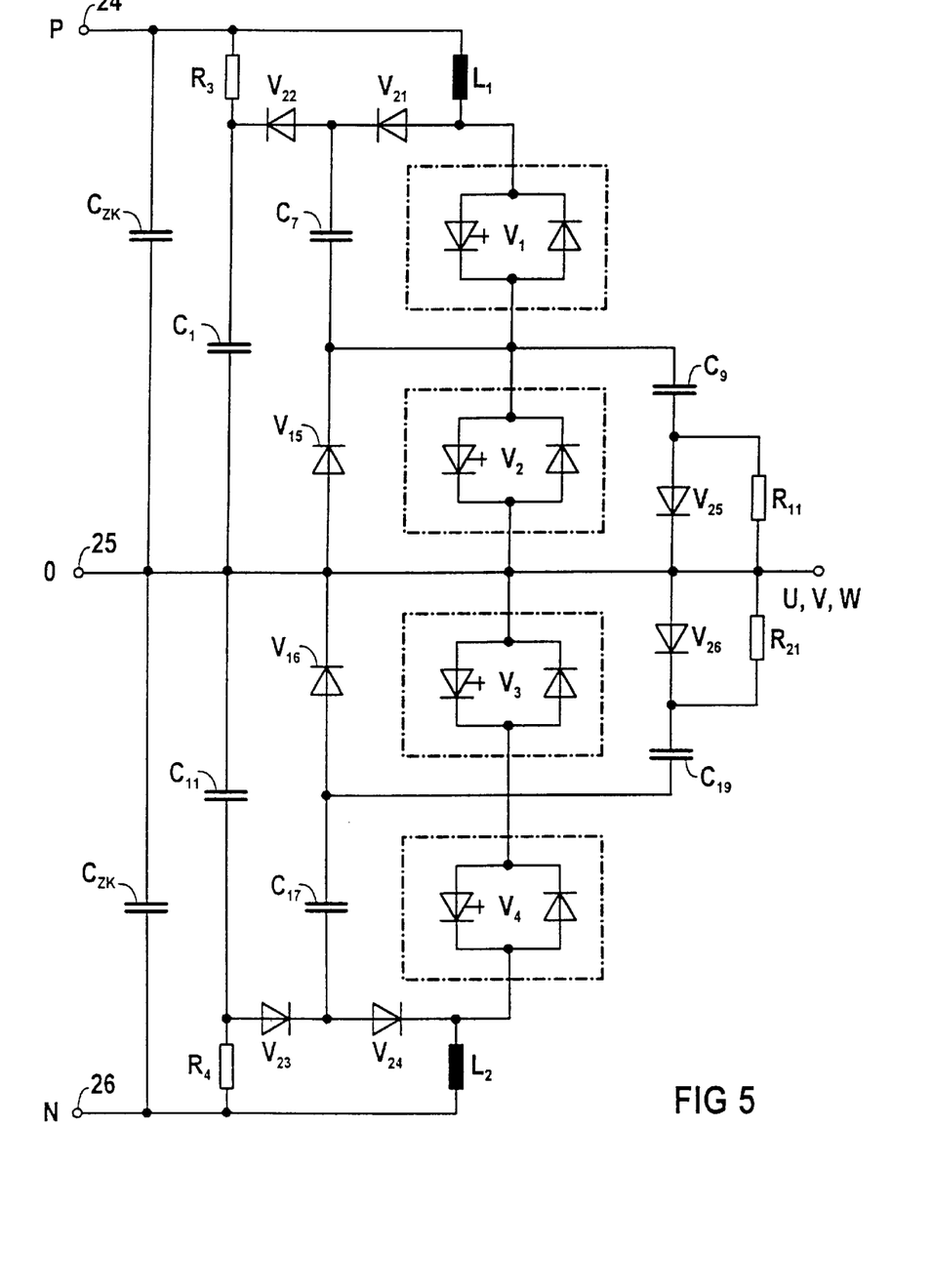
FIG. 5 shows a three-point inverter module having RC-GTOs and a protective network.

FIG. 5 shows a three-point-inverter module having RC-GTOs and a protective network. The series circuit of an inductor LI, four RC-GTOs (Reverse Conducting Gate-Turn-Off-Thyristors) V1, V2, V3, V4, and inductor L2 between positive DC voltage pole 24 and negative DC voltage pole 26, together with two center point diodes V15 and V16, form the main circuit of phase module of a three-point inverter. In this circuit, V15 is connected, by way of the anode, to DC voltage center point 25 and, by way of the cathode, to the tie point of first RC-GTO VI to second RC-GTO V2. V16 is connected, by way of the cathode, to DC voltage center point 25 and, by way of the anode, to the tie point of third RC-GTO V3 to fourth RC-GTO V4. The tie point between second RC-GTO V2 and third RC-GTO V3 forms the AC voltage output of phase module V (V or W).

L1 and L2 function to limit the rate of current rise, and protective networks V21 and V22, together with C7 and C1, as well as V24 and V23, together with C17 and C11, function to limit the rate of voltage rise when the GTOs are switched. The energy stored in the respective protective network per switching operation is converted into heat in resistors R3 and R4, and the overloading of capacitors C1 and C11 is prevented or fed back.

Two RCD protective networks R11, C9, V25 and R21, C19, V26 function as additional protective circuits of two middle RC-GTOs V2 and V3. They are advantageously used in the case of high-power converters, consequently having large mechanical dimensions, in order to prevent overvoltages on design-related parasitic inductances of GTOs V2 and V3.

Figure 6:
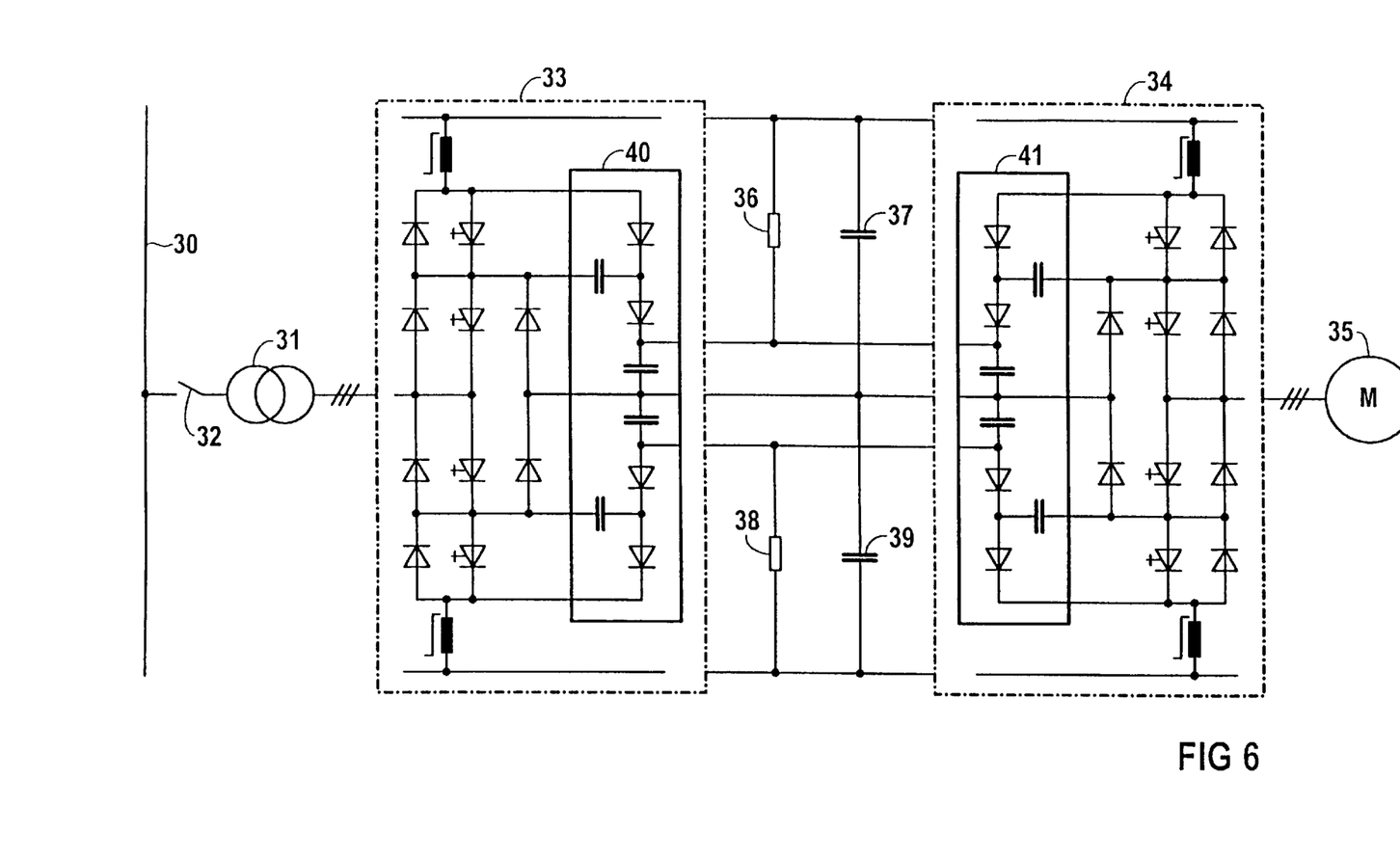
FIG. 6 shows a converter arrangement for feeding a three-phase AC motor having a component converter in a three-point circuit on the line and machine sides.

FIG. 6 shows a converter arrangement for feeding a three-phase machine, line-side component converter 33 and motor-side component converter 34 being designed, identically in each case, having GTOs in a three-point circuit. The main circuit of a phase module is represented in each case with its protective network 40 and 41, respectively. P-side link capacitor 37 forms, together with N-side link capacitor 39, the DC link via which the two component converters are connected. P-side protective circuit charge reversal resistor 36 and N-side protective circuit charge reversal resistor 38 are connected to the respective side of protective networks 40 and 41, respectively. Line-side component converter 33 is connected on the output side to line 30 via transformer 31 and circuit breaker 32. Machine-side component converter 34 is connected on the output side to three-phase AC motor 35.

Figure 7:
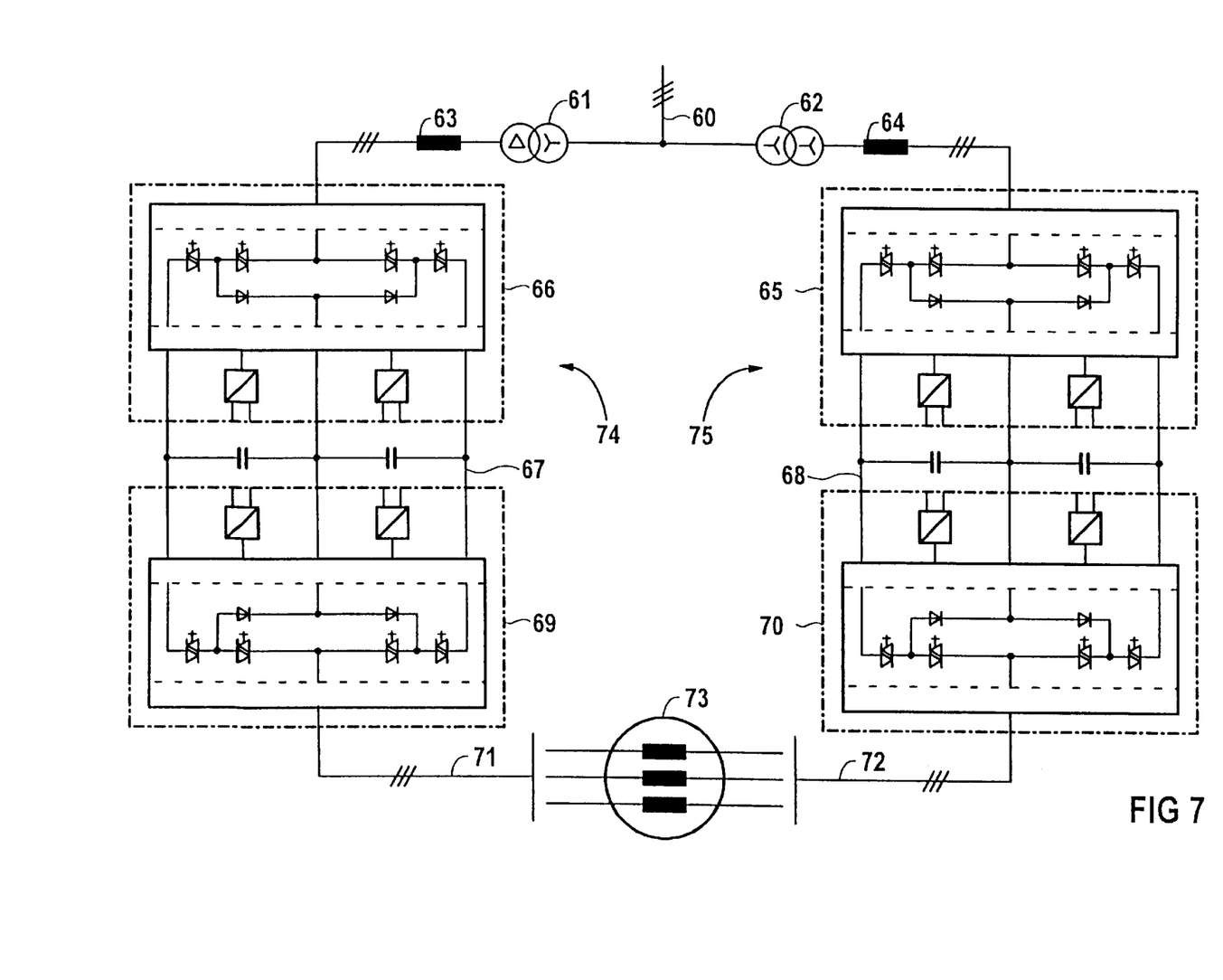
FIG. 7 shows a converter arrangement for bilateral feeding of a three-phase AC motor having an open winding having a component converter in a three-point circuit.

In the arrangement in FIG. 7, a first converter 74 and a second converter 75 are connected on the output side respectively to a side 71 and 72 of the open three-phase winding of three-phase AC motor 73. In addition to doubling the power, this arrangement results in a particularly advantageous operational performance since, assuming an appropriately tuned pulse procedure, a largely sinusoidal current characteristic is achieved in the motor having a low harmonic load even in the case of a low operating frequency of the GTO thyristors.

On the line side, first converter 74 is connected to power supply system 60 via an optional line-side additional inductor 63 and a first transformer 61, for example in a star/delta connection. Second converter 75 is connected to power supply system 60 via an optional line-side additional inductance 64 and a second transformer 62, advantageously offset (for example in a star/star connection) electrically by 300 with respect to first transformer 61. This arrangement produces particularly favorable system perturbations on the line, in particular when, as in the present example, the converters include component converters in a three-point circuit. The result in this case is a sinusoidal current characteristic with a very low harmonic content, even in the case of fundamental loading of the self-commutated line converters.

Two converters 74 and 75 each respectively have line-side component converters 66 and 65 and machine-side component converters 69 and 70, which are respectively connected via a DC link 67 and 68. Two DC links 67 and 68 are separated from one another electrically. All component converters 66, 65, 69, 70 are designed in a three-point circuit, preferably with RC-GTOs.

Figure 8:
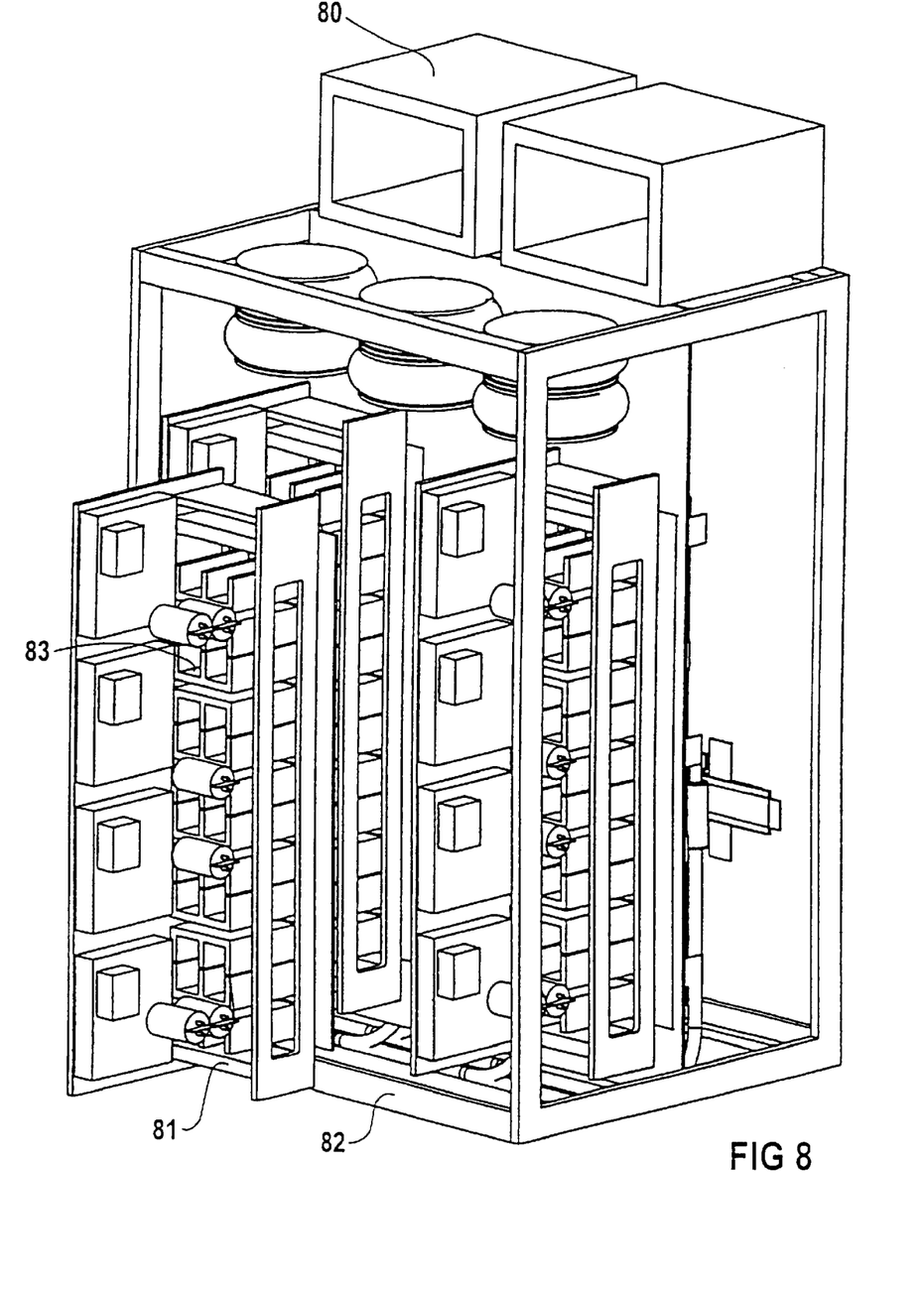
FIG. 8 shows the mechanical design of a converter according to the present invention.

FIG. 8 shows the mechanical design of an air-cooled rectifier according to the present invention. The semiconductor elements are accommodated, in the present exemplary embodiment, on a removable rectifier module 81. Rectifier 10 module 81 can be inserted into a carrier 82. Carrier 82 is shown in FIG. 8 without side walls and without doors. Cooling is performed via an air flow which is produced by means of fans 80 and flows through carrier 82 and inserted rectifier module 81. The semiconductors of rectifier module 81 are advantageously arranged between heat sinks 83, which are cooled in parallel by the air flow.

Figure 9:
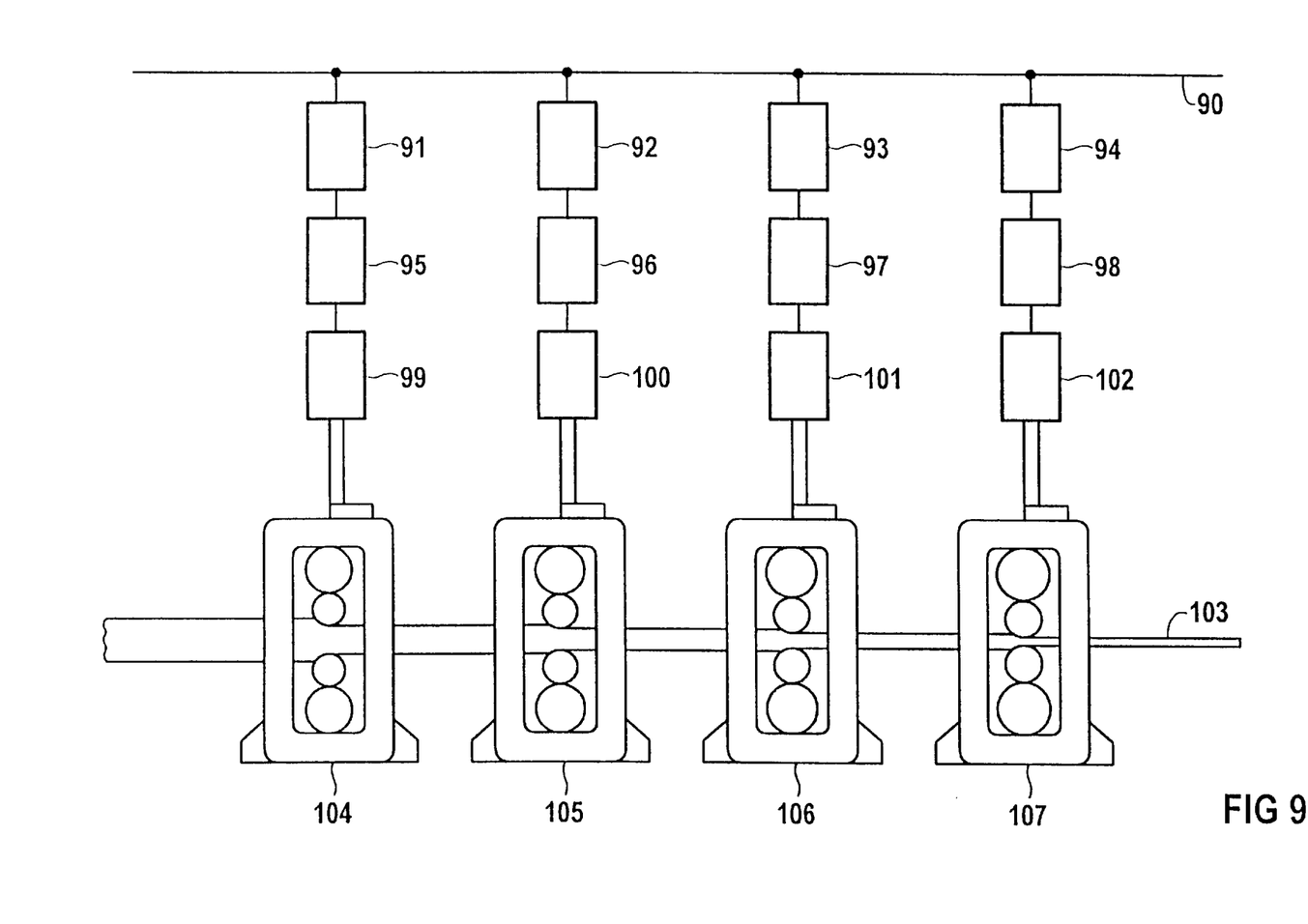
FIG. 9 shows the use of a converter according to the present invention in a rolling mill.

FIG. 9 shows a converter 95, 96, 97, 98 according to the present invention in a rolling mill. The material to be rolled 103 is rolled in rolling stands 104, 105, 106, 107, which are driven by electric motors 99, 100, 101, 102. Motors 99, 100, 101, 102 are fed by a power supply system 90 via in each case one transformer 91, 92, 93, 94 and in each case one converter 95, 96, 97, 98 according to the present invention.

What is claimed is:

1. A driving arrangement for rolling stands of a rolling mill, comprising:
    a control system which prescribes predetermined values for the rolling stands via control units; and
    at least one air-cooled power converter supplying electric energy from a power supply system to at least one three-phase AC motor of the rolling stands, the at least one air-cooled power converter including turn-off power semiconductors and heat sinks, at least some of the heat sinks being thermally connected in parallel;
    wherein a cooling power of the at least one air-cooled power converter is dimensioned such that a temperature of the turn-off power semiconductors does not exceed a critical temperature limit for continuous operation,
    wherein the at least one air-cooled power converter includes a DC link, and
    wherein the at least one air-cooled power converter is included in a three-point circuit, the three-point circuit having a mean operating frequency less than 250 Hz.

2. The driving arrangement according to claim 1, wherein the heat sinks electrically connect individual ones of the turn-off power semiconductors.

3. The driving arrangement according to claim 1, wherein the at least one air-cooled power converter reacts thermally with a time delay as a function of peak loads due to a thermal capacity of the heat sinks.

4. The driving arrangement according to claim 1, further comprising:
   a blower cooling the turn-off power semiconductors, the blower one of i) feeding one of ambient air and pre-cooled air to the heat sinks, and ii) sucks ambient air through the heat sinks.

5. The driving arrangement according to claim 1, wherein the at least one air-cooled power converter is a direct converter.

6. The driving arrangement according to claim 1, wherein the turn-off power semiconductors include gate turn-off thyristors.

7. The driving arrangement according to claim 1, wherein the turn-off power semiconductors include MOS controlled thyristors.

8. The driving arrangement according to claim 1, wherein the turn-off power semiconductors include insulated gate bipolar transistors.

9. The driving arrangement according to claim 1, wherein the turn-off power semiconductors are reverse conducting.

10. The driving arrangement according to claim 1, wherein the at least one air-cooled power converter operates in a power range of 1 to 20 megawatts with reference to a continuous load.

11. The driving arrangement according to claim 10, wherein the power range is 2 to 10 megawatts.

12. The driving arrangement according to claim 1, wherein the at least one air-cooled power converter operates in a power range of 2 to 30 megawatts with reference to an impulse load.

13. The driving arrangement according to claim 12, wherein the power range is 4 to 20 megawatts.

14. A driving arrangement for rolling stands of a rolling mill, comprising:
   a control system which prescribes predetermined values for the rolling stands via control units; and
   at least one air-cooled power converter supplying electric energy from a power supply system to at least one three-phase AC motor of the rolling stands, the at least one air-cooled power converter including turn-off power semiconductors and heat sinks at least some of the heat sinks being thermally connected in parallel;
   wherein a cooling power of the at least one air-cooled power converter is dimensioned such that a temperature of the turn-off power semiconductors does not exceed a critical temperature limit for continuous operation, and
   wherein the at least one air-cooled power converters includes two air-cooled power converters, and wherein the at least one three-phase AC motor is connected to the two air-cooled power converters in tandem, the at least one three-phase AC motor including open windings, the two air-cooled power converters feeding the windings bilaterally and having a mean operating frequency less than 100 Hz.

15. The driving arrangement according to claim 14, wherein the control system is designed as a function of characteristics of the at least one air-cooled power converter.

16. The driving arrangement according to claim 14, wherein the at least one power converter is an unfused converter.

17. A driving arrangement for rolling stands of a rolling mill, comprising:
   a control system which prescribes predetermined values for the rolling stands via control units; and
   at least one air-cooled power converter supplying electric energy from a power supply system to at least one three-phase AC motor of the rolling stands, the at least one air-cooled power converter including turn-off power semiconductors and heat sinks, at least some of the heat sinks being thermally connected in parallel;
   wherein a cooling power of the at least one air-cooled power converter is dimensioned such that a temperature of the turn-off power semiconductors does not exceed a critical temperature limit for continuous operation,
   wherein the at least one air-cooled power converter includes a DC link, and
   wherein the at least one air-cooled power converter is included in an n-point circuit, wherein n is one of greater than and equal to 5, the n-point circuit having a mean operating frequency less than 250 Hz.

18. The driving arrangement according to claim 17, wherein the heat sinks electrically connect individual ones of the turn-off power semiconductors.

19. The driving arrangement according to claim 17, wherein the at least one air-cooled power converter reacts thermally with a time delay as a function of peak loads due to a thermal capacity of the heat sinks.

20. The driving arrangement according to claim 17, further comprising:
   a blower cooling the turn-off power semiconductors, the blower one of i) feeding one of ambient air and pre-cooled air to the heat sinks, and ii) sucks ambient air through the heat sinks.

21. The driving arrangement according to claim 17, wherein the at least one air-cooled power converter is a direct converter.

22. The driving arrangement according to claim 17, wherein the turn-off power semiconductors include gate turn-off thyristors.

23. The driving arrangement according to claim 17, wherein the turn-off power semiconductors include MOS controlled thyristors.

24. The driving arrangement according to claim 17, wherein the turn-off power semiconductors include insulated gate bipolar transistors.

25. The driving arrangement according to claim 17, wherein the turn-off power semiconductors are reverse conducting.

26. The driving arrangement according to claim 17, wherein the at least one air-cooled power converter operates in a power range of 1 to 20 megawatts with reference to a continuous load.

27. The driving arrangement according to claim 26, wherein the power range is 2 to 10 megawatts.

28. The driving arrangement according to claim 17, wherein the at least one air-cooled power converter operates in a power range of 2 to 30 megawatts with reference to an impulse load.

29. The driving arrangement according to claim 28, wherein the power range is 4 to 20 megawatts.

* * * * *